United States Patent
Chu et al.

(10) Patent No.: US 6,542,393 B1
(45) Date of Patent: Apr. 1, 2003

(54) DUAL-BANK MEMORY MODULE WITH STACKED DRAM CHIPS HAVING A CONCAVE-SHAPED RE-ROUTE PCB IN-BETWEEN

(75) Inventors: Tzu-Yih Chu, San Jose, CA (US); Ren-Kang Chiou, Fremont, CA (US)

(73) Assignee: MA Laboratories, Inc., San Jose, CA (US)

( * ) Notice: Subject to any disclaimer, the term of this patent is extended or adjusted under 35 U.S.C. 154(b) by 0 days.

(21) Appl. No.: 10/063,452

(22) Filed: Apr. 24, 2002

(51) Int. Cl.7 ................................................. G11C 5/02
(52) U.S. Cl. ........................ 365/51; 365/52; 257/777; 438/109; 361/729; 361/735
(58) Field of Search ........................ 365/51, 52, 63; 257/723, 777, 784; 361/729, 735; 438/109

(56) References Cited

U.S. PATENT DOCUMENTS

| | | | |
|---|---|---|---|
| 4,884,237 A | 11/1989 | Mueller et al. | 365/63 |
| 5,227,995 A | 7/1993 | Klink et al. | 365/63 |
| 5,473,196 A | 12/1995 | De Givry | 257/786 |
| 5,514,907 A | 5/1996 | Moshayedi | 257/723 |
| 5,545,922 A | 8/1996 | Golwalkar et al. | 257/676 |
| 5,910,685 A | 6/1999 | Watanabe et al. | 257/777 |
| 5,995,379 A | 11/1999 | Kyougoku et al. | 361/803 |
| 6,005,778 A | * 12/1999 | Spielberger et al. | 361/770 |
| 6,122,187 A | 9/2000 | Ahn et al. | 365/63 |
| 6,140,149 A | 10/2000 | Wark | 438/105 |
| 6,236,115 B1 | 5/2001 | Gaynes et al. | 257/774 |
| 6,242,285 B1 | * 6/2001 | Kang | 438/109 |
| 6,313,998 B1 | 11/2001 | Kledzik et al. | 361/767 |
| 6,333,562 B1 | * 12/2001 | Lin | 257/777 |
| 6,424,030 B2 | * 7/2002 | Masayuki et al. | 257/685 |
| 6,472,734 B2 | * 10/2002 | Arakawa et al. | 257/686 |
| 6,487,078 B2 | * 11/2002 | Kledzik et al. | 361/704 |

OTHER PUBLICATIONS

Legacy Electronics, Inc, "Canopy 3–D Manufacturing FAQ", Feb. 21, 2001.
Legacy Electronics Corporate Website, pp. 1–7 and diagram, 4/02.

* cited by examiner

Primary Examiner—Son Mai
(74) Attorney, Agent, or Firm—Stuart T. Auvinen

(57) ABSTRACT

A memory module has memory chips in stacks. The lower memory chip in a stack has pins that are soldered to pads on the module substrate. A hollowed printed-circuit board (PCB) has a hollow opening on the bottom with about the same width, length, and depth as the top cap of the lower memory chip. The hollowed PCB fits over the top cap of the lower memory chip and has lower pads on its lower surface but outside of the hollow opening. The lower pads are soldered to the top shoulders of the pins of the lower memory chip. An upper memory chip has pins that are soldered to pads on the upper surface of the hollowed PCB. The hollowed PCB has a metal trace that re-routes a second bank-select signal from a no-connect pin of the lower memory chip to a bank-select pin of the upper memory chip.

20 Claims, 6 Drawing Sheets

PCB TOP VIEW

PCB BOTTOM VIEW

BOTTOM VIEW
PCB WITH LOWER CHIP

DUAL-BANK MEMORY MODULE WITH STACKED DRAM CHIPS HAVING A CONCAVE-SHAPED RE-ROUTE PCB IN-BETWEEN

BACKGROUND OF INVENTION

This invention relates to memory modules, and more particularly for stacking memory chips on memory modules.

Memory modules are extremely popularity today. Most personal computers (PC's) are shipped with sockets for memory modules so the PC user can later add additional modules, increasing the memory capacity of the PC. Other devices may also use memory modules designed for PC's. High-volume production and competition have driven module costs down dramatically, benefiting the buyer.

Memory modules are made in many different sizes and capacities, with the older 30-pin modules being replaced by 72-pin and 168-pin modules. The pins were originally pins extending from the module's edge, but now most modules are leadless, having metal contact pads or leads. The modules are small in size, some being about 5.25 inches long and 1.2 or 1.7-inch high.

The modules contain a small printed-circuit board substrate, typically a multi-layer board with alternating laminated layers of fiberglass insulation and foil or metal interconnect layers. Surface mounted components are soldered onto one or both surfaces of the substrate. Dynamic-RAM integrated circuits (IC's) or chips are commonly packaged in inexpensive surface-mount packages such as small-outline J-leaded (SOJ) packages, Plastic Leaded chip carriers (PLCC's), Thin Small-Outline Packages (TSOP) or small-outline (SO) packages.

The number of DRAM chips in a module depends on the capacity and data-width of the DRAM chips and the size of the memory module. For example, a memory module constructed from 64 Mega-bit×4-bit-output DRAM chips needs 16 of these 4-bit-wide DRAM chips to fill a 64-bit bus. The module has a capacity of 512 Megabytes (MB).

A memory module can have more than one bank. A two-bank memory module with a total capacity of 1024 MB can have two banks of 16 DRAM chips per bank, using 64M×4 chips.

FIG. 1 is a schematic of a memory module with two banks of DRAM chips. DRAM chips 12–16 form a first bank, while DRAM chips 22–26 from a second bank. A total of 16 DRAM chips 12–16 are in the first bank, while another 16 DRAM chips 22–26 form the second bank. When 64M×4 DRAM chips are used, each bank contains 512 MB.

Most signals are shared by all DRAM chips in both banks. For example, control signals such as RAS (row address strobe), CAS (column address strobe), write-enable, clocks, etc. and address lines are connected to all DRAM chips in both banks on the memory module. Data lines are each shared by one chip in each of the banks. Data lines D0–D3 are shared by DRAM chip 12 in the first bank and DRAM chip 22 in the second bank. Likewise, data lines D4–D7 are shared by DRAM chips 13, 23.

The banks are selected by chip-select signals. Only one chip select is activated at a time for the memory module. Chip select CS1 activates DRAM chips 12–16 in the first bank, while chip select CS0 selects DRAM chips 22–26 in the second bank. When the bank's chip select is not activated, the control signals are ignored by DRAM chips in the bank. The data lines are not driven by the non-selected bank of DRAM chips to prevent data conflicts.

FIG. 2 shows a prior-art double-bank memory module with stacked DRAM chips. While a 2-bank memory module can be constructed from non-stacked chips, twice as much surface area on the substrate would be needed. The memory module contains a substrate 10, with surface-mounted DRAM chips 22–26 mounted directly to the front surface or side of substrate 10, while more DRAM chips (not visible) are mounted to the back side or surface of substrate 10. Eight stacks of DRAM chips can be mounted on the front surface of substrate 10 for bits 0–31, while another eight stacks of chips can be mounted on the back side for bits 32–63. Metal contact pads 20 are positioned along the connector edge of the module on both front and back surfaces. Metal contact pads 20 mate with pads on a module socket to electrically connect the module to a PC's motherboard. Holes and/or notches are sometimes used to ensure that the module is correctly positioned in the socket.

Often the number of DRAM chips desired on a memory module is larger than the available substrate surface area. One method to squeeze more DRAM chips to a module is to stack DRAM chips on top of one another. For example, DRAM chip 12 can be mounted directly on top of DRAM chip 22. The leads or pins of upper DRAM chip 12 can be soldered to the leads or pins of lower DRAM chip 22.

Usually DRAM chips from separate banks are stacked together. The DRAM chips stacked together share the same data lines as well as control signals. DRAM chips 12–16 of the first bank are stacked on top of DRAM chips 22–26 of the second bank. When chips are mounted to both surfaces of substrate 10, two chips can be stacked together on the front surface and two chips can be stacked together on the back surface at each location of the substrate. Each surface can have mounting locations for 8 DRAM chips, for a total of 16 mounting locations (only 5 locations are shown in the FIG.). With stacking, a total of 32 DRAM chips can be mounted to substrate 10.

FIG. 3 is an exploded view showing stacking of a pair of DRAM chips. Upper DRAM chip 12 of the first bank is mounted on the top of the stack, with lower DRAM chip 22 mounted below to the module substrate. One side of pins is shown, but pins are usually on two or even on all four of the four sides of a DRAM IC package.

Between upper DRAM chip 12 and lower DRAM chip 22 is thin printed-circuit board (PCB) 30. Thin PCB 30 is a thin circuit board that can be made from fiberglass with printed metal layers on its two major surfaces. Thin PCB 30 has bonding pads 40 on its upper surface that are arranged for making contact with the pins S1–S7 from upper DRAM chip 12. The pins from upper DRAM chip 12 are soldered to these bonding pads 40 on the upper surface of thin PCB 30 during manufacturing.

The bottom surface of thin PCB 30 also has leads C1–C7 that are arranged to make contact with the tops of the pins S1–S7 of lower DRAM chip 22. These leads C1–C7 of thin PCB 30 are soldered to the pins S1–S7 of lower DRAM chip 22. Thus thin PCB 30 has bonding pads on the top surface that are soldered to pins of upper DRAM chip 12, and has leads that are soldered to pins of lower DRAM chip 22.

Each of the leads is connected to an upper bonding pad either directly above or through a drilled via or a metalized connection through the substrate of thin PCB 30. Thus thin PCB 30 electrically connects pins from lower DRAM chip 22 to the pins of upper DRAM chip 12 that are directly above.

All of the address, data, RAS, CAS, clock, power, ground, and most other signals are shared among the two stacked DRAM chips 12, 22 in this way by directly connecting corresponding pins S1–S7 in upper and lower DRAM chips 12, 22. For example, pin 1 (S1) of upper DRAM chip 12 caries signal SI and connects through the first of bonding pads 40 on the top surface of thin PCB 30 to lead C1 which is soldered to pin 1 (signal S1) of lower DRAM chip 22.

While most pins of lower DRAM chip 22 are connected with the pins directly above of upper DRAM chip 12, there are some exceptions. The chip-select pins are disconnected and re-routed by thin PCB 30 so that the stacked DRAM chips receive different chip-select signals. This allows one of the DRAM chips 12, 22 to be selected and the other de-selected.

For example, chip select CS0 connects to lower DRAM chip 22 through pin 3. Chip select CS0 controls the second DRAM bank that includes lower DRAM chip 22. The connection from CS0 to thin PCB 30 is broken by the removal of lead C3 of thin PCB 30. Without the C3 lead, no connection is made between pin 3 of lower DRAM chip 22 and thin PCB 30.

DRAM chips often include unused pins known as no-connect (NC) pins. These pins do not connect to circuitry inside the DRAM chip, but are still present as physical pins or leads on the package. In this example, DRAM chips 12, 22 have pin 5 as a NC pin.

The chip-select CS1 signal from the memory module substrate is connected to pin 5 of lower DRAM chip 22. Rather than leave an isolated bonding pad on the substrate of the memory module under pin 5, this bonding pad is connected by metal traces on the memory module substrate to the CS1 signal line. Since pin 5 is a NC pin, lower DRAM chip 22 ignores this CS1 signal.

However, pin 5 of lower DRAM chip 22 is soldered to lead C5 of thin PCB 30. Wiring trace 32 on thin PCB 30 electrically connects lead C5 to another one of bonding pad 40, the bonding pad with the missing C3 lead. This bonding pad is soldered to pin 3 of upper DRAM chip 12. Thus the CS1 signal from the memory-module substrate is routed up through the no-connect pin 5 of lower DRAM chip 22 to lead C5 of thin PCB 30. Then wiring trace 32 moves this CS1 signal from C5 to the bonding pad for the missing C3 lead. From this bonding pad for C3, the CS1 signal is carried to pin 3 of upper DRAM chip 12. Pin 3 of DRAM chips 12, 22 is the chip-select input.

Thin PCB 30 allows lower DRAM chip 22 to receive CS0 at it pin-3 chip-select input, while routing CS1 from an unused pin (5) of lower DRAM chip 22 to the pin-3 chip-select input of upper DRAM chip 12.

FIGS. 4A–B show cross-section views of stacked DRAM chips with a thin PCB in-between. FIG. 4A shows separated components while FIG. 4B shows the final assembled stack. Lower DRAM chip 22 has pins 46 that are soldered to metal pads on substrate 10 of the memory module. Upper DRAM chip 12 has pins 42 that are for soldering to bonding pads 40 on the top surface of thin PCB 30'. Bonding pads 40 may be the upper part of leads 44. Leads 44 can be J-leads that have bottom ends that are for soldering to the top shoulders of pins 46 of lower DRAM chip 22.

Soldering leads 44 to the upper shoulders of pins 46 can be difficult due to the small size of pins 46 and the small shoulder region of these pins 46. FIG. 5 is another prior-art embodiment of stacked DRAM chips using L-leads. Rather than use J-leads that attach to pin shoulders, thin PCB 30' has L-leads 48 that are soldered to metal pads 45 on the top of substrate 10 of the memory module. Pads 45 can be enlarged to make room for the foot of L-leads 48 next to pins 46 from lower DRAM chip 22.

Via 41 can be drilled through thin PCB 30' and metalized to make contact from bonding pads 40 on the upper surface of thin PCB 30' to L-leads 48 that are on the bottom of thin PCB 30'. A conductive material may be incorporated into thin PCB 30' during manufacture of thin PCB 30' rather than drilling vias 41.

Other prior-art methods to stack DRAM chips include using a lead-frame rather than thin PCB 30. The lead-frame can have leads that are soldered to the shoulder of the pins of lower DRAM chip 22. The pins of upper and lower DRAM chips 12, 22 can also be directly soldered together without an intervening thin PCB by bending pins of the upper DRAM chip. To re-route the chip select signals, pins can be bent or cut and a wire jumper used, or a much smaller PCB insert is inserted between the pins and the DRAM package, perpendicular to the direction of thin PCB 30.

While these stacking techniques are useful, low yields and complexity can hinder their economy. What is desired is an improved DRAM-stacking technique.

BRIEF DESCRIPTION OF DRAWINGS

FIGS. 4A–B show cross-section views of stacked DRAM chips with a thin PCB in-between.

DETAILED DESCRIPTION

The present invention relates to an improvement in stacked-chip memory modules. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 6A:
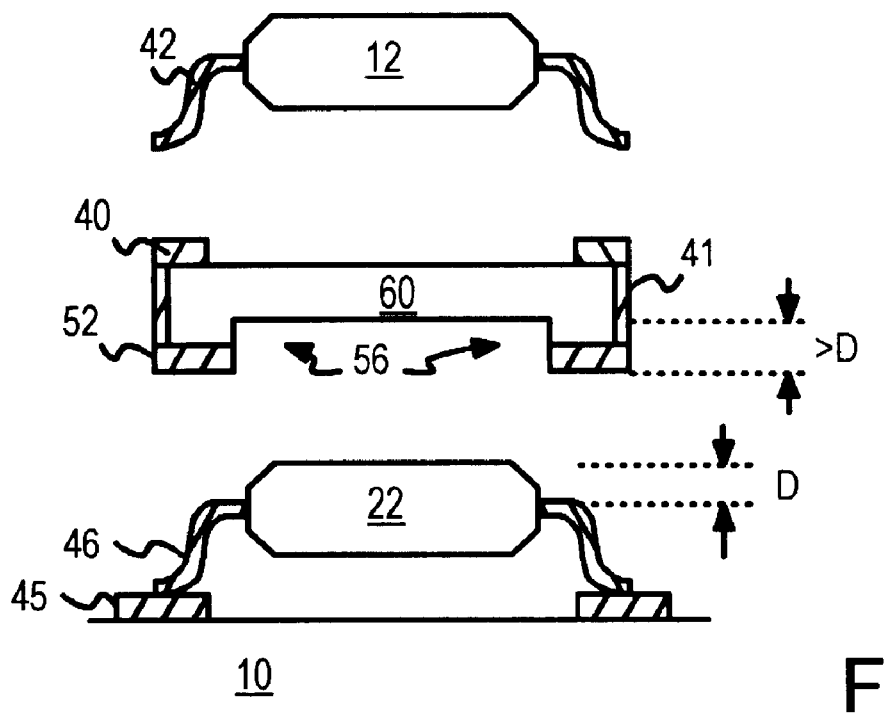
FIGS. 6A–B show stacked memory chips using an improved PCB in-between that has a hollow for fitting around the top of the lower memory chip.
Figure 6B:
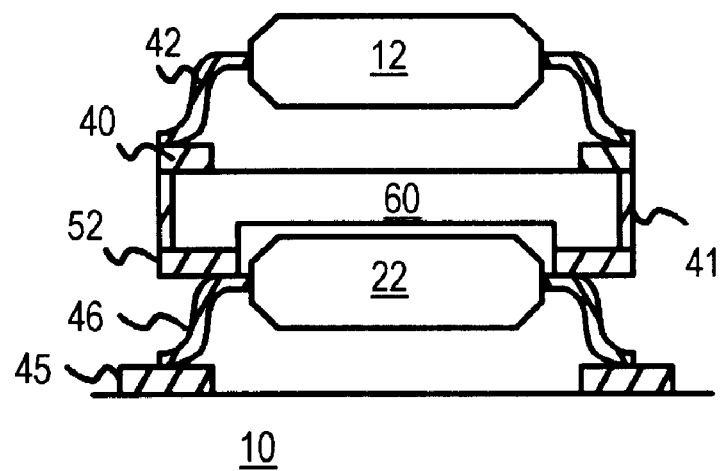

FIGS. 6A–B show stacked memory chips using an improved PCB in-between that has a hollow for fitting around the top of the lower memory chip. FIG. 6A shows separated components while FIG. 6B shows the final assembled stack. Hollowed PCB 60 fits between upper DRAM chip 12 and lower DRAM chip 22. Hollowed PCB 60 contains a hollow shape or opening 56 in its bottom surface. Hollowed opening 56 is the same size or slightly larger in area as the cap or top of lower DRAM chip 22.

Hollowed PCB 60 fits over lower DRAM chip 22 since the depth of hollowed opening 56 is about the same or larger than the height of the cap (D) of lower DRAM chip 22. The height of the cap is the distance D from the top shoulder of pins 46 to the top surface of lower DRAM chip 22. The depth of hollowed PCB 60 can be measured from the lower surface of hollowed PCB 60 in the middle of opening 56 to the surface of lower pads 52 on the bottom surface of hollowed PCB 60. This depth of opening 56 can be equal to the height of the DRAM cap D or larger than D.

Upper DRAM chip 12 has pins 42 that are soldered to bonding pads 40 on the upper surface of hollowed PCB 60. Vias 41 are either drilled and metalized, or can be formed during PCB processing and connect bonding pads 40 to lower pads 52 of hollowed PCB 60. The feet of pins 46 of lower DRAM chip 22 are soldered to metal pads 45 on the surface of substrate 10 of the memory module.

Figure 1:
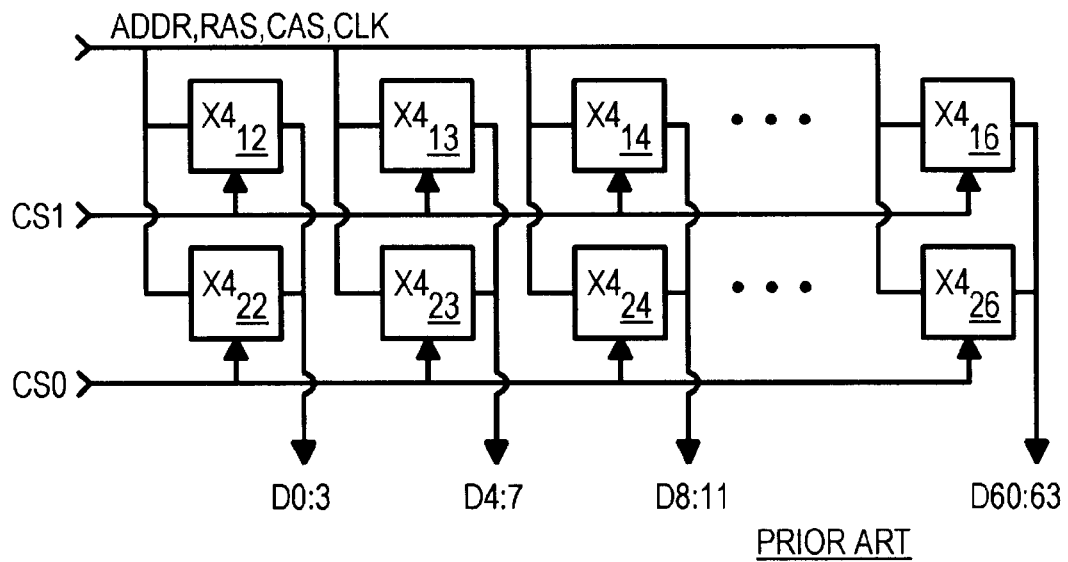
FIG. 1 is a schematic of a memory module with two banks of DRAM chips.
Figure 2:
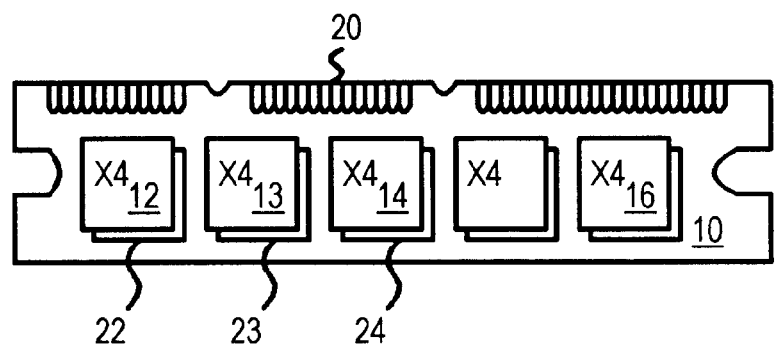
FIG. 2 shows a prior-art double-bank memory module with stacked DRAM chips.
Figure 3:
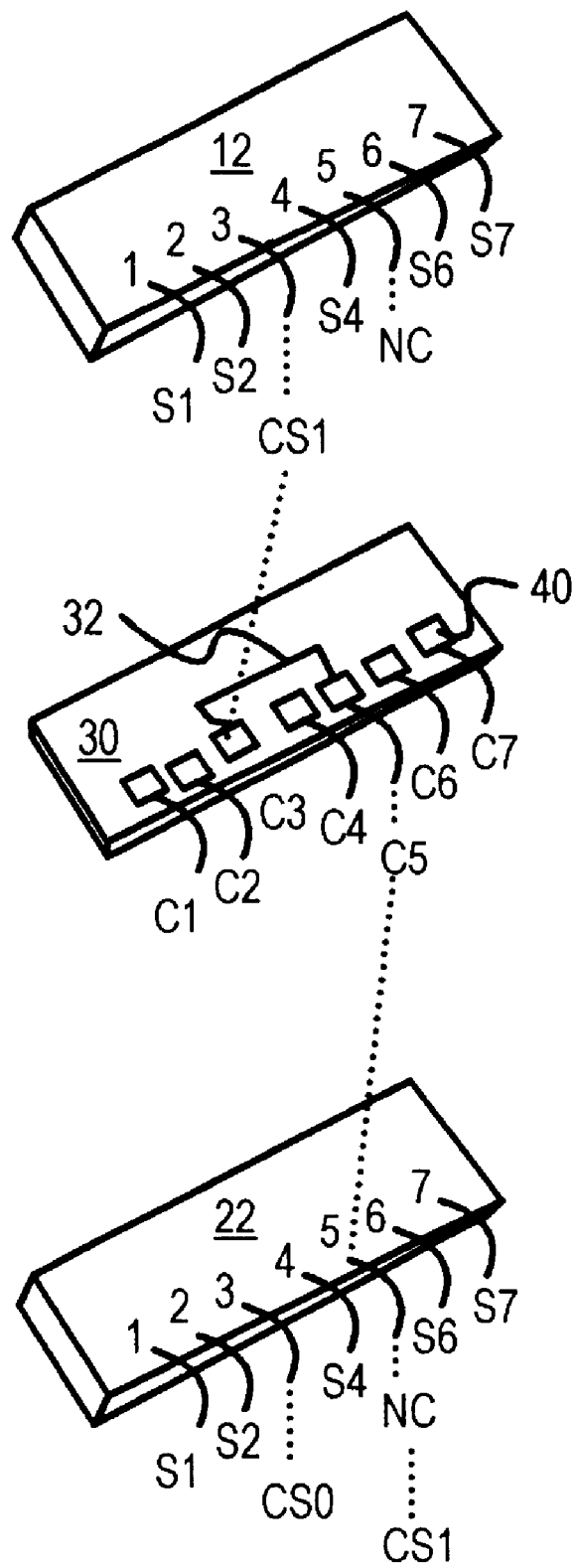
FIG. 3 is an exploded view showing stacking of a pair of DRAM chips.
Figure 4A:
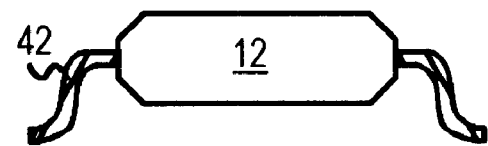
Figure 4A:
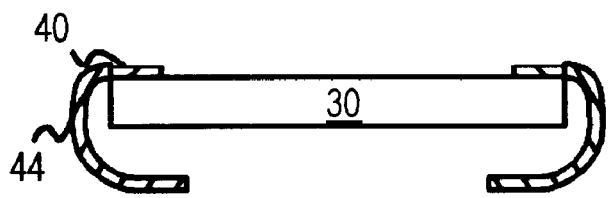
Figure 4B:
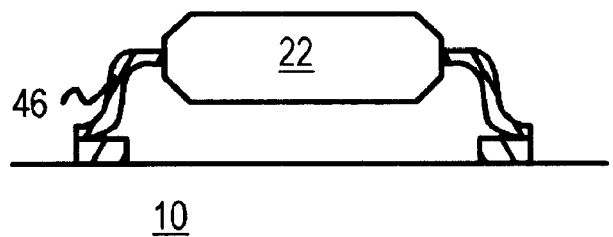
Figure 5:
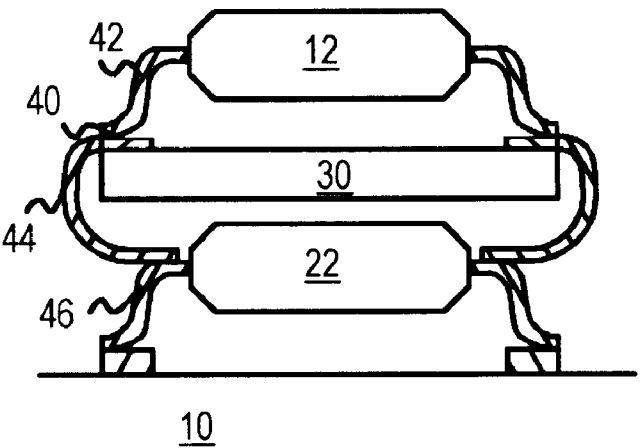
FIG. 5 is another prior-art embodiment of stacked DRAM chips using L-leads.
Figure 5:
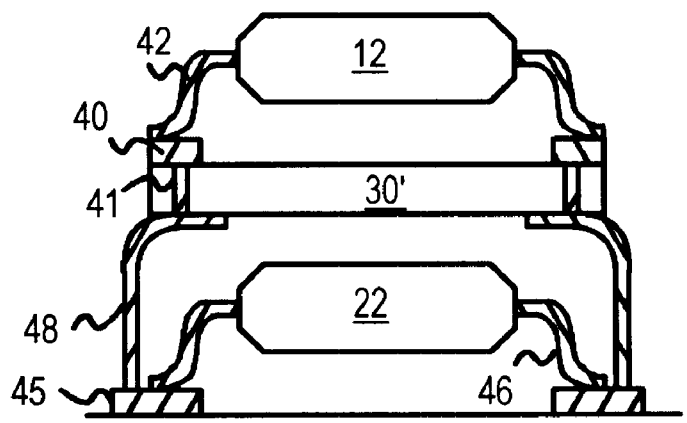

Lower pads 52 are soldered to the top shoulders of pins 46 of lower DRAM chip 22. Since these lower pads 52 are pads rather than leads, they are more easy to and solder than are the leads of FIGS. 4A–B. Opening 56 helps align lower pads 52 over pins 46 during assembly, since the cap of lower DRAM chip 22 must fit within opening 56. Hollow opening 56 helps guide hollowed PCB 60 over lower DRAM chip 22, allowing for more precise alignment before soldering. The vertical edges of opening 56 can be sloped (not shown) to better guide in lower DRAM chip 22 toward the final alignment during assembly.

The width, length, and depth of hollowed opening 56 are chosen to match or slightly exceed those for the cap of lower DRAM chip 22. Hollow opening 56 can be formed during PCB manufacture by removing layers of the PCB over opening 56 but leaving the layers in place outside of opening 56. Opening 56 could also be made by grinding or cutting away parts of hollowed PCB 60.

Figure 7A:
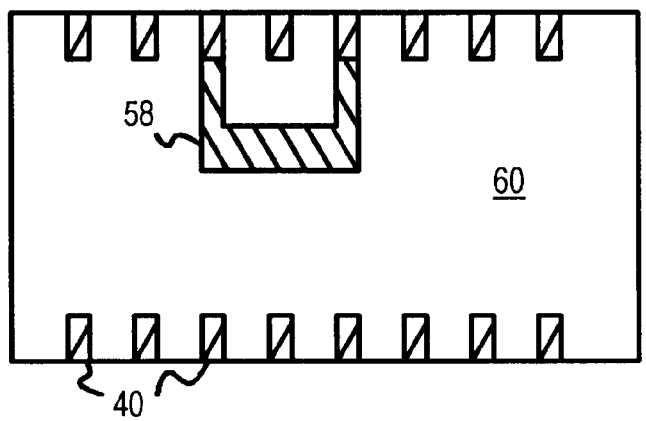
FIG. 7A shows a top or overhead view of the hollowed PCB.

FIG. 7A shows a top or overhead view of the hollowed PCB. The top surface of hollowed PCB 60 is shown. Bonding pads 40 are formed along the sides of hollowed PCB 60 in the same arrangement as the pins of upper DRAM chip, since these pins are soldered to bonding pads 40.

Trace 58 connects bonding pads 40 for pin 3 (chip select) and pin 5 (no-connect). Trace 58 re-routes the chip select signal from the no-connect pin 5 of the lower DRAM chip to the chip-select pin 3 of the upper DRAM chip.

Figure 7B:
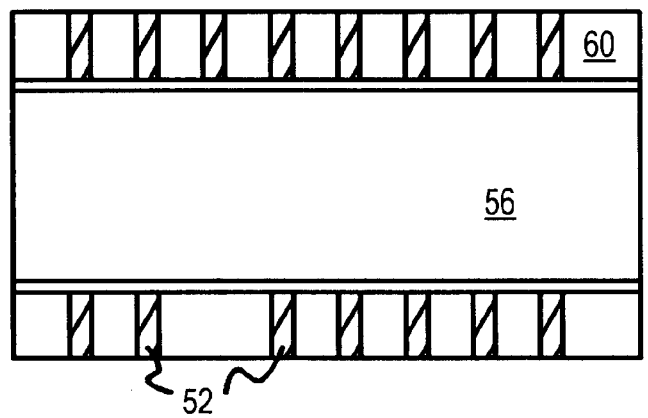
FIG. 7B shows a bottom view of the hollowed PCB.

FIG. 7B shows a bottom view of the hollowed PCB. The bottom surface of hollowed PCB 60 is shown that faces the top of the lower DRAM chip. Lower pads 52 are formed along the sides of hollowed PCB 60 in the same arrangement as the pins of the lower DRAM chip, since these pins are soldered to lower pads 52.

One of lower pads 52 is missing, to prevent connection to the chip-select pin of the lower DRAM chip. Thus the chip select for the lower DRAM chip is disconnected from hollowed PCB 60 and the upper DRAM chip. Alternately, the lower pad can be present and soldered to the chip-selection pin of the lower DRAM chip, but no via or connection is provided to this lower pad to electrically isolate it.

Lower pads 52 are formed on the full-thickness parts of hollowed PCB 60 along the perimeter. In the middle of hollowed PCB 60 is a thinner region, hollowed opening 56. The width, length, and depth of hollowed opening 56 are chosen to match or slightly exceed those for the cap of lower DRAM chip 22.

Vias are drilled through hollowed PCB 60 to connect bonding pads 40 with lower pads 52. These vias can be metalized to make electrical contact between a pair of upper and lower-surface pads. Alternately, a metal connection can be formed within the PCB itself during processing.

Figure 8:
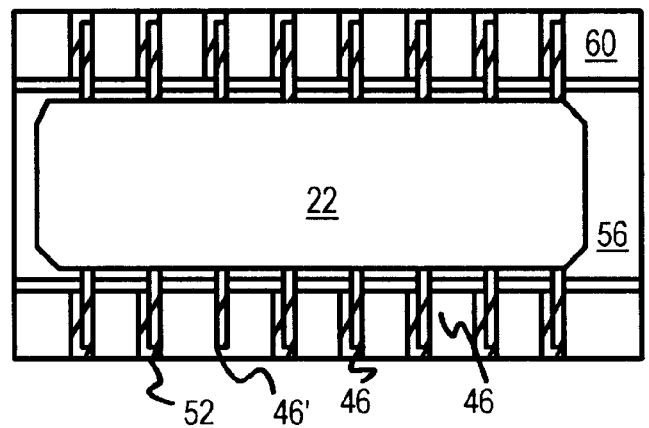
FIG. 8 is a bottom view of the stack, showing the lower DRAM chip soldered to the bottom surface of the hollowed PCB.

FIG. 8 is a bottom view of the stack, showing the lower DRAM chip soldered to the bottom surface of the hollowed PCB. Lower DRAM chip 22 has pins 22 that are soldered to lower pads 52 of hollowed PCB 60. These pins 52 may extend out beyond the edge of hollowed PCB 60 or may be shorter as shown. The top shoulder of pins 46 are soldered to lower pads 52.

Lower DRAM chip 22 fits within hollowed opening 56, which is a thinner region of hollowed PCB 60 in the middle, between thicker regions that support lower pads 52. The width, length, and depth of hollowed opening 56 are chosen to match or slightly exceed those for the top cap of lower DRAM chip 22. Opening 56 can extend all the way to the left and right edges of hollowed PCB 60 as shown when lower DRAM chip 22 has pins on only two sides. Alternately, opening 56 can be narrower than shown and just fit lower DRAM chip 22.

One of lower pads 52 is missing, over pin 3, the chip-select input to lower DRAM chip 22. Pin 46' of lower DRAM chip 22 does not connect to any pad of hollowed PCB 60 since the corresponding lower pad is missing.

Figure 9A:
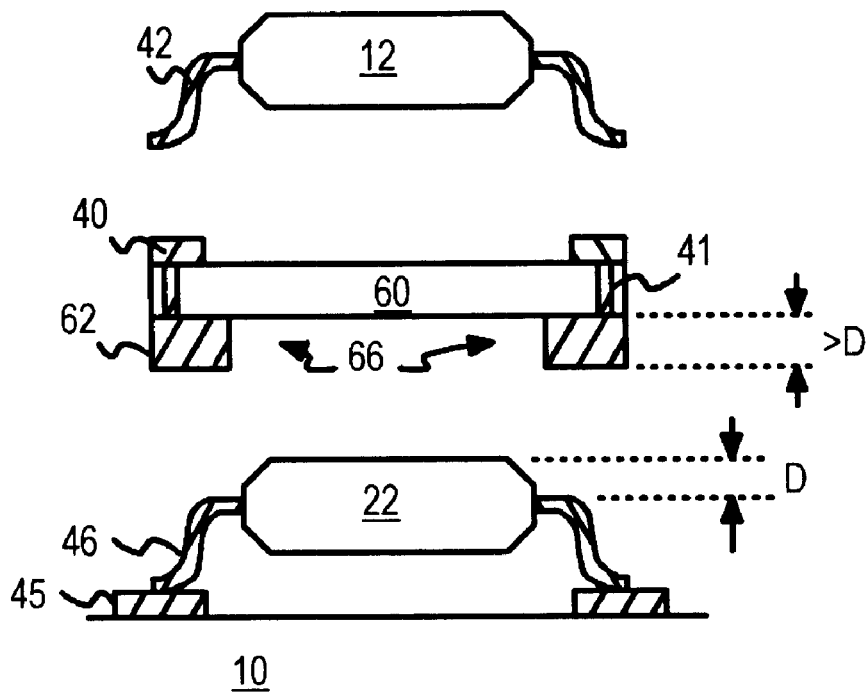
FIGS. 9A–B show an alternate embodiment where the hollow opening is formed by thick lower pads.
Figure 9B:
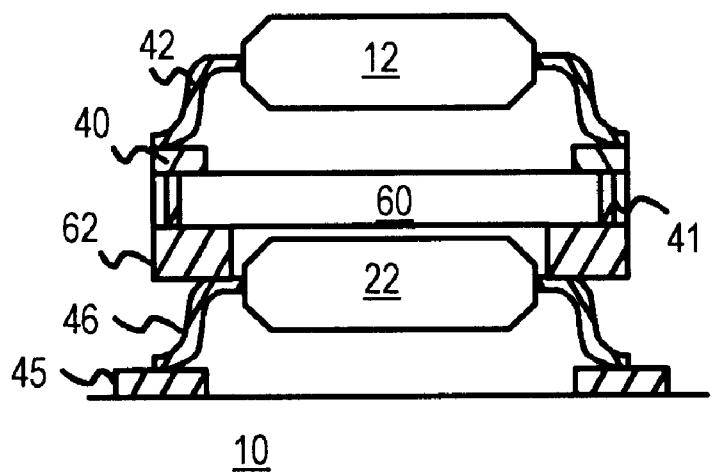

FIGS. 9A–B show an alternate embodiment where the hollow opening is formed by thick lower pads. FIG. 9A shows separated components while FIG. 9B shows the final assembled stack. Upper DRAM chip 12 has pins 42 that are soldered to bonding pads 40 on the upper surface of hollowed PCB 60. Vias 41 connect bonding pads 40 with thick pads 62 on the bottom surface of hollowed PCB 60. Thick pads 62 are soldered to the top shoulders of pins 46 of lower DRAM chip 22. Pins 46 are also soldered to pads 45 on substrate 10.

The thickness of thick pads 62 is increased to at least D, the distance from the top surface of lower DRAM chip 22 to the top shoulders of pins 46. In between thick pads 62 is formed opening 66, which fits over the cap of lower DRAM chip 22.

Alternate Embodiments

Several other embodiments are contemplated by the inventors. For example three or four DRAM chips could be stacked together using two or three hollowed PCB's in between. Three of four chip-selects could be used, and the memory module could have 3 or four banks. Rather than select banks using chip-select, other signals could be used such as an address or data strobe signal. Some memories may have more than one chip select input, and some combination of these chip selects could be used to select the DRAM chips.

During manufacture, solder paste can be spread on lower pads 52. Then the module substrate is placed it on top of the lower DRAM chips. When placed into an oven, the surface tension characteristic of the solder paste causes lower pads 52 and the shoulder of lower chip pins 46 to be perfectly self-aligned as solder re-flows. Therefore, due to the self-alignment, the shape of the hollow opening can have a large tolerance.

The number of DRAM chips, capacitors, buffers, and other components on each side of the substrate can be varied. Wide or narrow DRAM chips of one, two, or eight or more bits may be substituted. Other kinds of Integrated Circuits (IC's) can be mounted, such as an address or bank decoder or a parity generator or error detector.

Future memory modules may use memory chips other than DRAMs, or improved DRAMs such as synchronous or super-pipelined DRAMs. Some bursting DRAMs re-name the CAS signal as the chip-enable signal (CE), since they do not need a column address for all accesses. The chip-enable signal may be considered as a type of CAS signal for some memories. In the examples pins 3 and 5 have been used for the chip select and no-connect, but these could be any pin locations and vary with the exact memory chip pinout. Additional traces could be added to the hollowed PCB 60. Integral components such as capacitors and resistors that are formed as part of the PCB could be part of hollowed PCB 60.

The terms front surface and back surface are arbitrarily assigned as shown in the Figures and each term could refer to either surface of the module in relation to the notch. Vias of through-holes provide electrical connection between the surfaces or intermediate layers. These through-holes could be filled in holes or metal traces between layers rather than open holes, and can also be formed during the PCB processing as an integral part of the PCB.

The invention could be applied to other kinds of modules besides memory modules, and could be used for stacking other kinds of chips such as buffers, registers, latches, processing arrays, etc. The invention could also be used to stack other kinds of memories than DRAM, such as flash memories, and could be used to stack secondary chips on a memory module, such as buffers and latches.

The electrical assignment of functions or signals to pins or leads, the metal contact pads along the bottom of the module, is usually determined by an industry standard-setting committee, such as JEDEC. JEDEC specifies the order of the pins and the size of the module to allow for interchangeability of modules with sockets. Redundant power and ground pins are usually assigned symmetric positions to avoid reversing the power and ground supplies if the module is inserted backwards. DRAM chips are usually connected to a data pin as close to the chip as possible to minimize wiring lengths and delay. Older 72-pin modules are being replaced by 168-pin and larger modules. Multi-layer printed circuit board (PCB) substrates can share the power and ground planes with signal traces to reduce the number of layers used from 8 layers to 6 layers. Many other configurations are possible. Modules with multiple rows of leads, such as dual-inline-memory modules (DIMMs) can also benefit from the invention.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC §112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A memory module comprising:
   a substrate with a connector and metal traces that electrically connect signals on the connector to metal pads on the substrate;
   a plurality of stacks of memory chips, each stack comprising:
      a lower memory chip having lower pins that are soldered to the metal pads on the substrate, the lower memory chip having a cap region of a chip package above the lower pins;
      an upper memory chip having upper pins;
      a hollowed printed-circuit board (PCB) between the lower memory chip and the upper memory chip, the hollowed PCB having a hollowed opening on a lower surface that fits over the cap region of the lower memory chip;
      upper bonding pads on an upper surface of the hollowed PCB, the upper bonding pads being soldered to the upper pins of the upper memory chip; and
      lower bonding pads on the lower surface of the hollowed PCB but outside the hollowed opening, the lower bonding pads being soldered to the lower pins of the lower memory chip,
      whereby the lower memory chip fits the hollowed opening of the hollowed PCB between the upper and lower memory chips in a stack.

2. The memory module of claim 1 further comprising:
   a re-route trace on the hollowed PCB between a re-routed pair of the upper bonding pads.

3. The memory module of claim 2 wherein the re-route trace conducts a first bank-selecting signal from a no-connect pin of the lower memory chip to a bank-selecting pin of the upper memory chip.

4. The memory module of claim 3 further comprising:
   a bank-selecting pin of the lower memory chip that receives a second bank-selecting signal from the substrate, the bank-selecting pin of the lower memory chip not being soldered to any of the lower bonding pads on the hollowed PCB,
   the bank-selecting pin being under a missing lower bonding pad to prevent connection of the bank-selecting pin to the hollowed PCB,
   whereby connection from the hollowed PCB to the bank-selecting pin of the lower memory chip is broken.

5. The memory module of claim 4 wherein the upper memory chip is in a first memory bank that is selected by the first bank-selecting signal while the lower memory chip is in a second memory bank that is selected by the second bank-selecting signal.

6. The memory module of claim 5 wherein the memory chips are dynamic-random-access memory (DRAM) chips having address, data, and controls signals.

7. The memory module of claim 1 wherein the lower bonding pads are soldered to top shoulders of the upper pins of the lower memory chip, while bottom feet of the lower pins are soldered to the metal pads on the substrate.

8. The memory module of claim 7 wherein the hollowed PCB has a greater board thickness outside of the hollowed opening than the board thickness over the hollowed opening, whereby the hollowed opening is formed by a thinning of board thickness of the hollowed PCB.

9. The memory module of claim 8 wherein a difference of the board thickness outside of the hollowed opening and over the hollowed opening is at least as much as a distance from top shoulders of the lower pins to a top surface of the lower memory chip.

10. The memory module of claim 7 wherein the lower bonding pads are thicker than the upper bonding pads;
wherein the hollowed PCB has a same board thickness outside of the hollowed opening as the board thickness over the hollowed opening,
whereby the hollowed opening is formed by thicker lower bonding pads of the hollowed PCB.

11. The memory module of claim 10 wherein the lower bonding pads have a thickness at least as much as a distance from top shoulders of the lower pins to a top surface of the lower memory chip.

12. The memory module of claim 7 further comprising:
vias or metalized connections through the hollowed PCB to connect upper bonding pads with lower bonding pads.

13. A stacked-bank memory module comprising:
a plurality of memory stacks mounted on a module substrate, each stack comprising:
first memory means for storing data in a first bank in response to a first bank-select signal from the module substrate, the first memory means connected to the module substrate by first pins;
second memory means for storing data in a second bank in response to a second bank-select signal from the module substrate, the second memory means having second pins for connection;
stacking board means, between the first memory means and the second memory means, for re-routing the second bank-select signal to a bank-select pin of the second pins;
upper pad means, on an upper surface of the stacking board means, for connecting to the second pins of the second memory means;
lower pad means, a lower surface of the stacking board means, for connecting to the first pins of the first memory means;
wiring means, on the stacking board means, for connecting the lower pad means to the upper pad means;
fitting means, on the lower surface of the stacking board means, for fitting around an upper part of the first memory means, the upper part being a part of a semiconductor package containing the first memory means, the upper part being substantially above the first pins,
whereby assembly of the memory stack is facilitated by the fitting means of the stacking board means.

14. The stacked-bank memory module of claim 13 wherein the fitting means is a depression in the lower surface of the stacking board means;
whereby the first memory means fits into the depression in the lower surface of the stacking board means.

15. The stacked-bank memory module of claim 14 wherein the fitting means comprises an area between the lower pads means, wherein the lower pad means have a thickness at least as thick as a height of the upper part of the first memory means.

16. The stacked-bank memory module of claim 15 wherein the lower pad means contact the first pins at a shoulder of the first pins, while pads on the module substrate contact the first pins at feet of the first pins.

17. The stacked-bank memory module of claim 13 wherein the wiring means connects an upper pad means to a lower pad means that is directly below the upper pad means.

18. The stacked-bank memory module of claim 13 wherein the second bank-select signal is re-routed by the wiring means from a no-connect pin of the first pins to the bank-select pin of the second pins, wherein the no-connect pin does not make electrical connection to circuitry of the first memory means.

19. A stacked-memory module comprising:
a primary substrate having two surfaces for mounting stacks of memory chips thereon;
each stack of memory chips comprising:
a lower memory chip in a first, bank that is activated by a first bank-select signal from the primary substrate;
lower leads from the lower memory chip, the lower leads for connecting to metal pads on the primary substrate;
an upper memory chip in a second bank that is activated by a second bank-select signal from the primary substrate;
upper leads from the upper memory chip;
a stack board situated between the upper memory chip and the lower memory chip;
upper contacts along at least two side of an upper surface of the stack board, the upper contacts for connecting to the upper leads;
lower contacts along at the least two sides of a lower surface of the stack board, the lower contacts for connecting to the lower leads; and
a hollow on the lower surface of the stack board between the lower contacts, the hollow having a depth that is at least a height of a top surface of the lower memory chip above a top edge of the upper leads, the hollow having a width between the at least two sides, the width being at least as wide as a width of the top surface of the lower memory chip,
whereby the top surface of the lower memory chip fits in the hollow of the stack board.

20. The stacked-memory module of claim 1 9 wherein the stack board further comprise:
a route trace that connects a lower contact connected by a lower lead to a no-connect input of the lower memory chip to an upper contact that connects to a bank-select input of the upper memory chip through an upper lead;
wherein the second bank-select signal is routed from the primary substrate over the lower lead for the no-connect input to the lower memory chip, across the route trace on the stack board to the upper contact to the upper lead that connects to the bank-select input of the upper memory chip, whereby bank select is re-routed.

* * * * *